(12) United States Patent  
Asari et al.

(10) Patent No.: US 7,437,602 B2
(45) Date of Patent: Oct. 14, 2008

(54) MEMORY CARD APPARATUS CONFIGURED TO PROVIDE NOTIFICATION OF MEMORY CAPACITY

(75) Inventors: Shinsuke Asari, Akishima (JP); Chiaki Shinagawa, Kodaira (JP); Yasuhiro Nakamura, Tachikawa (JP); Motoki Kanamori, Kariya (JP); Atsushi Shiraishi, Miyakonojo (JP)

(73) Assignee: Renesas Technology Corp., Tokyo (JP)

( * ) Notice: Subject to any disclaimer, the term of this patent is extended or adjusted under 35 U.S.C. 154(b) by 521 days.

(21) Appl. No.: 11/079,093

(22) Filed: Mar. 15, 2005

(65) Prior Publication Data

US 2005/0232037 A1   Oct. 20, 2005

(30) Foreign Application Priority Data

Mar. 30, 2004   (JP)   ............... 2004-097458

(51) Int. Cl.
*G06F 11/00* (2006.01)

(52) U.S. Cl. .................. 714/6; 714/4; 714/5

(58) Field of Classification Search .......... 714/4, 714/5, 6
See application file for complete search history.

(56) References Cited

U.S. PATENT DOCUMENTS

| | | | | |
|---|---|---|---|---|
| 6,034,831 | A | * | 3/2000 | Dobbek et al. ............... 360/53 |
| 6,735,121 | B2 | | 5/2004 | Yoshida ................. 365/185.22 |
| 6,922,802 | B2 | * | 7/2005 | Kim et al. ................... 714/723 |
| 7,050,252 | B1 | * | 5/2006 | Vallis .......................... 360/53 |
| 2003/0033567 | A1 | | 2/2003 | Tamura et al. .............. 714/718 |
| 2004/0125716 | A1 | * | 7/2004 | Ko et al. .................. 369/47.14 |

FOREIGN PATENT DOCUMENTS

JP   2002-182989   6/2002
JP   2003-058432   2/2003

* cited by examiner

*Primary Examiner*—Emerson C Puente
(74) *Attorney, Agent, or Firm*—Miles & Stockbridge P.C.

(57) ABSTRACT

The service life of memory cards is to be substantially elongated against the occurrence of faulty blocks. A control logic searches blocks in a nonvolatile memory cell array for any acquired fault on the basis of a fault-inviting code in a management information section. If any faulty block is detected, the faulty block will be subjected to write/read comparison of data to judge whether or not the data in the block are normal. Any block determined to be normal will undergo rewriting of its fault-inviting code and registered as a normal block. Further, the registered block is stored into a write management table in the management area as a writable block. This enables an essentially normal block judged faulty on account of an erratic error or some other reason to be restored.

4 Claims, 12 Drawing Sheets

MEMORY CARD APPARATUS CONFIGURED TO PROVIDE NOTIFICATION OF MEMORY CAPACITY

BACKGROUND OF THE INVENTION

The present invention relates to a technique for life elongation of memory cards (nonvolatile memory apparatuses), and more particularly to a technique that can be effectively applied to the relief of essentially good blocks made faulty by an erratic error or otherwise.

As memory devices for use in personal computers and multifunctional terminals, memory cards including Multi Media Cards (registered trade mark) and Compact Flash (registered trademark, abbreviated to CF) cards are coming into rapidly expanding use.

To meet today's requirement for ever higher performance of semiconductor devices, nonvolatile memories permitting simultaneous electrical erasion or rewriting and capable of holding large volumes of data, such as flash memories, are used as semiconductor memories for mounting on memory cards.

When a flash memory undergoes repeated data writing and erasion, a certain proportion of its blocks (sectors) come to allow no more writing/erasion on account of the characteristics of the device. Unless the voltage supplied from the host to a memory card in writing data is constant, accidental failures in writing data into memory cells due to erratic errors or the like may arise, causing the controller of the memory card to judge blocks which would otherwise permit normal data writing/erasion to be faulty blocks.

In a memory card, a certain proportion of unused blocks are reserved to constitute a standby area in anticipation of the occurrence of faulty blocks during data processing, and a controller so performs processing that, once any faulty block arises during data processing, as to use no faulty block thereafter.

Formulas available for erasion/reading/writing out of or into memory cards include the so-called logical/physical coherent formula and the table formula.

By the logical/physical coherent formula for instance, a logical address designated by the host is assigned as it is to the physical address of the flash memory. In the flash memory, there are provided user data areas which the user can use and a standby area which can be substituted for a user area, and if any block in the user data area becomes faulty, the controller will process substitution to use a block in the standby area to replace that faulty block.

By the table formula, data writing is done by referencing a writable block management table indicating blocks into which data can be written and an address conversion table indicating the addresses of blocks into which data have been written.

In this case, an unused block zone is provided in the user data area. If any block in the user data area becomes faulty, fault registration will be processed by which the faultiness of that block is registered in the writable block management table, and a block having an unused block zone, which is a standby area, is registered as a new block.

Patent Reference 1: Japanese Unexamined Patent Publication No. 2002-182989 (U.S. Pat. No. 6,735,121)

Patent Reference 2: Japanese Unexamined Patent Publication No. 2003-058432 (U.S. patent application Ser. No. 10/082,291)

SUMMARY OF THE INVENTION

However, the present inventors have discovered that the above-described techniques for relieving faulty blocks in a memory card involve the following problems.

When a memory card continues to be used and the number of faulty blocks increases, that number of faulty blocks will eventually surpass the number of blocks secured to constitute the standby area. Then, the logical/physical coherent formula, by which substitution is processed, would give rise to addresses where no data can be written, while the table formula, by which faultiness is registered, there will arise a problem that no further data could be written, bringing the memory card to the end of its service life.

An object of the present invention is to provide a technique to elongate the service life of a memory card which would otherwise be shortened by the occurrence of faulty blocks.

The above-described and other objects and novel features of the present invention will become apparent from the following description in this specification when taken in conjunction with the accompanying drawings.

Typical aspects of the invention disclosed in the present application will be briefly described below.

According to the invention, there is provided a memory card provided with a function to notify the host of the memory capacity of its user-accessible area, further provided with a nonvolatile semiconductor memory having a plurality of nonvolatile memory cells and capable of storing prescribed items of information, and a controller for giving instructions to operate the nonvolatile semiconductor memory on the basis of externally issued commands, wherein the controller registers faultiness of any block which it has determined to be faulty at the time of writing data into the nonvolatile semiconductor memory, executes, after registering the block determined to be faulty, a determination test at a prescribed timing to perform write/read comparison on the block determined to be faulty and, if the block is found normal in reading/writing, determines it to be a good block to re-register the block as a normal block.

Other aspects of the invention under the present application will be summarized below.

In the memory card, the controller may reduce, when a block is re-registered as a normal block, the memory capacity of the user data area if the number of normal blocks in a valid data area is not more than a prescribed value, secure as a standby area the reduced blocks in the valid data area, and alter the memory capacity of the user data area stored in the system area of the nonvolatile semiconductor memory into the reduced memory capacity of the user data area.

Advantages achieved by some of the most typical aspects of the invention disclosed in the present application will be briefly described below.

(1) Since normal blocks determined to be faulty on account of an accidental or temporary cause such as an erratic error can be relieved, the service life of memory cards can be elongated.

(2) When the number of normal blocks in a valid data area is not more than a prescribed level, the service life of the memory card can still be elongated by reducing the user data area and securing its decrement as a standby area.

(3) The reliability of memory cards can be enhanced by virtue of (1) and (2) above.

DESCRIPTION OF THE PREFERRED EMBODIMENT OF THE INVENTION

A preferred embodiment of the present invention will be described in detail below with reference to the accompanying drawings. In the following description of the preferred embodiment of the invention, description of the same or similar parts will not be repeated in principle unless repetition is necessary.

Figure 1:
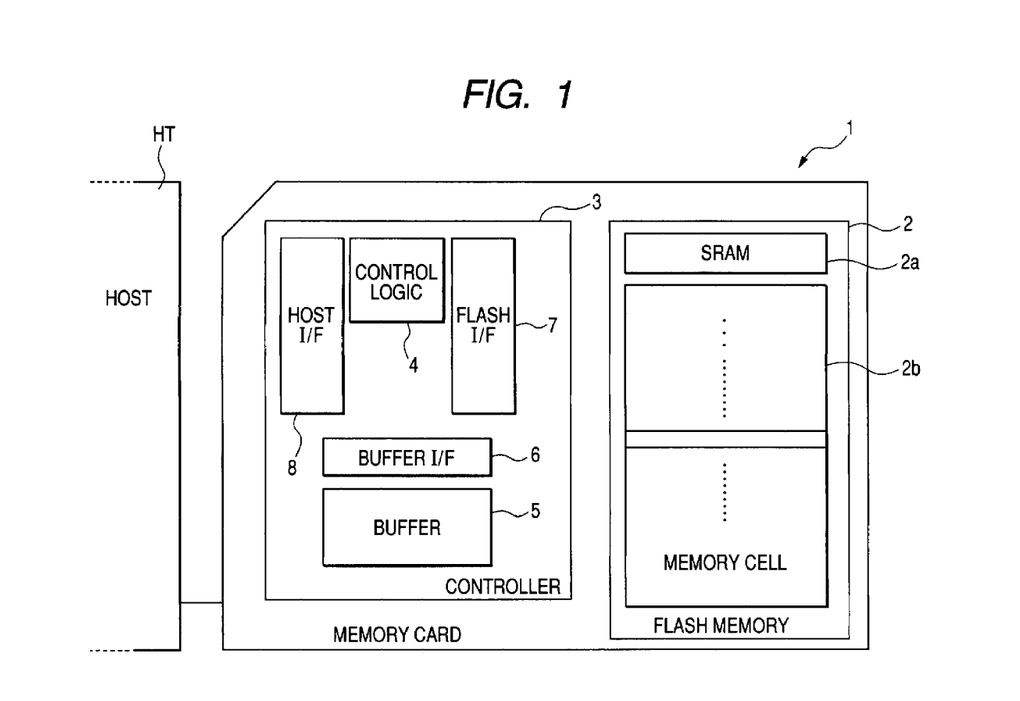
FIG. 1 is a block diagram of a memory card, which is a preferred embodiment of the present invention.
Figure 2:
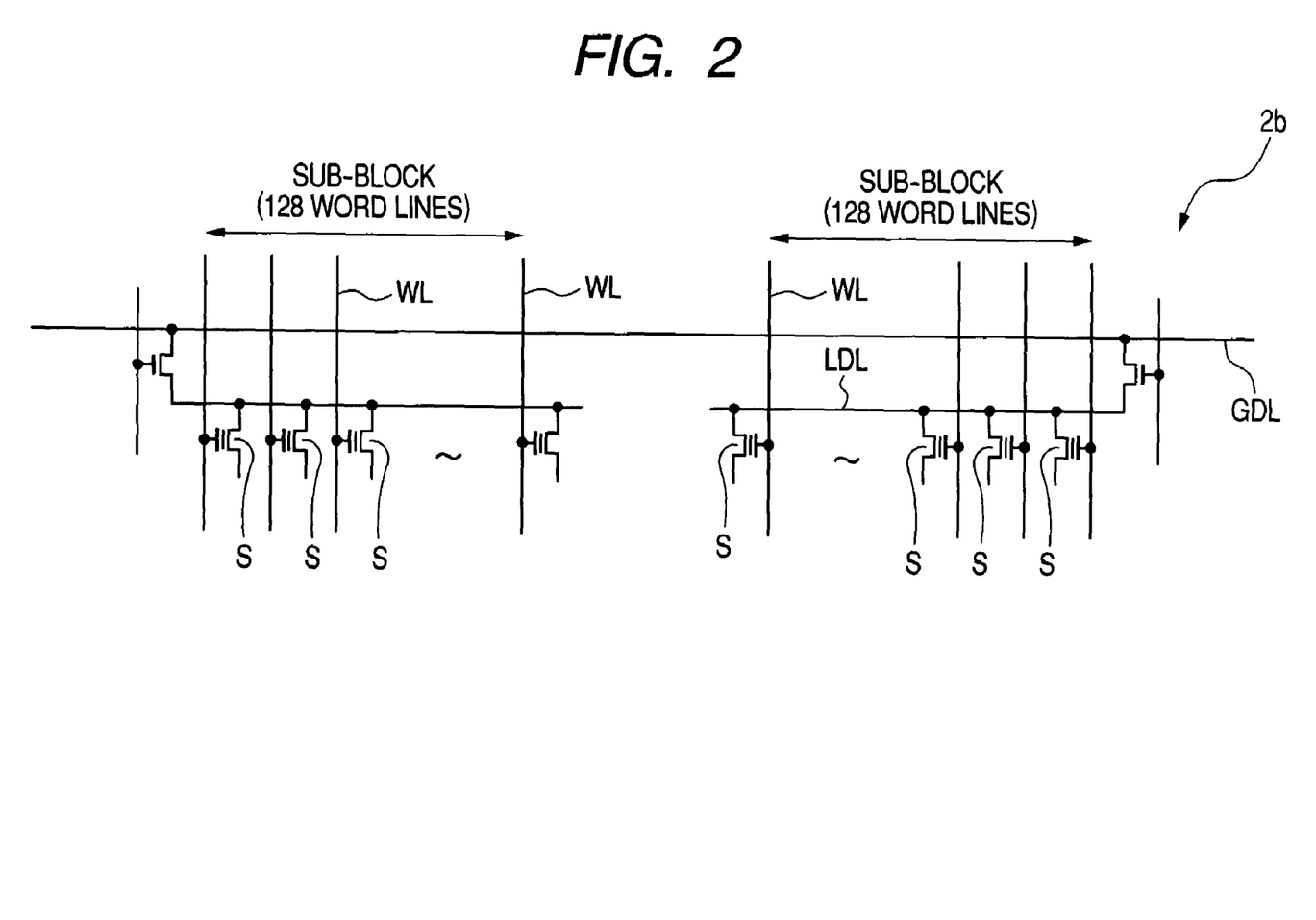
FIG. 2 illustrates the configuration of a nonvolatile memory cell array provided in the memory card of FIG. 1.
Figure 3:
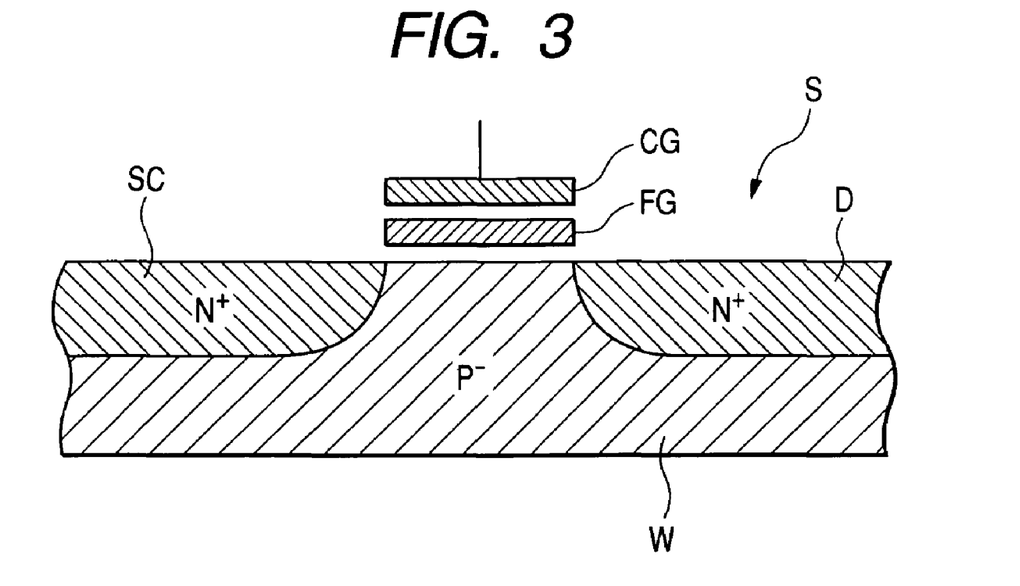
FIG. 3 is a sectional view showing the structure of a memory cell provided in the nonvolatile memory cell array of FIG. 2.
Figure 4:
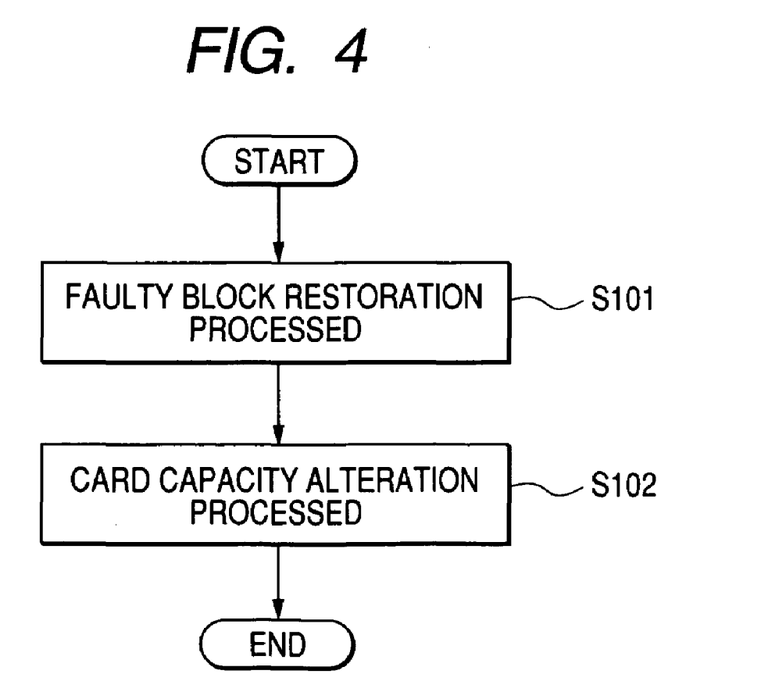
FIG. 4 is a flow chart showing one example of life elongation processing in the memory card of FIG. 1.
Figure 5:
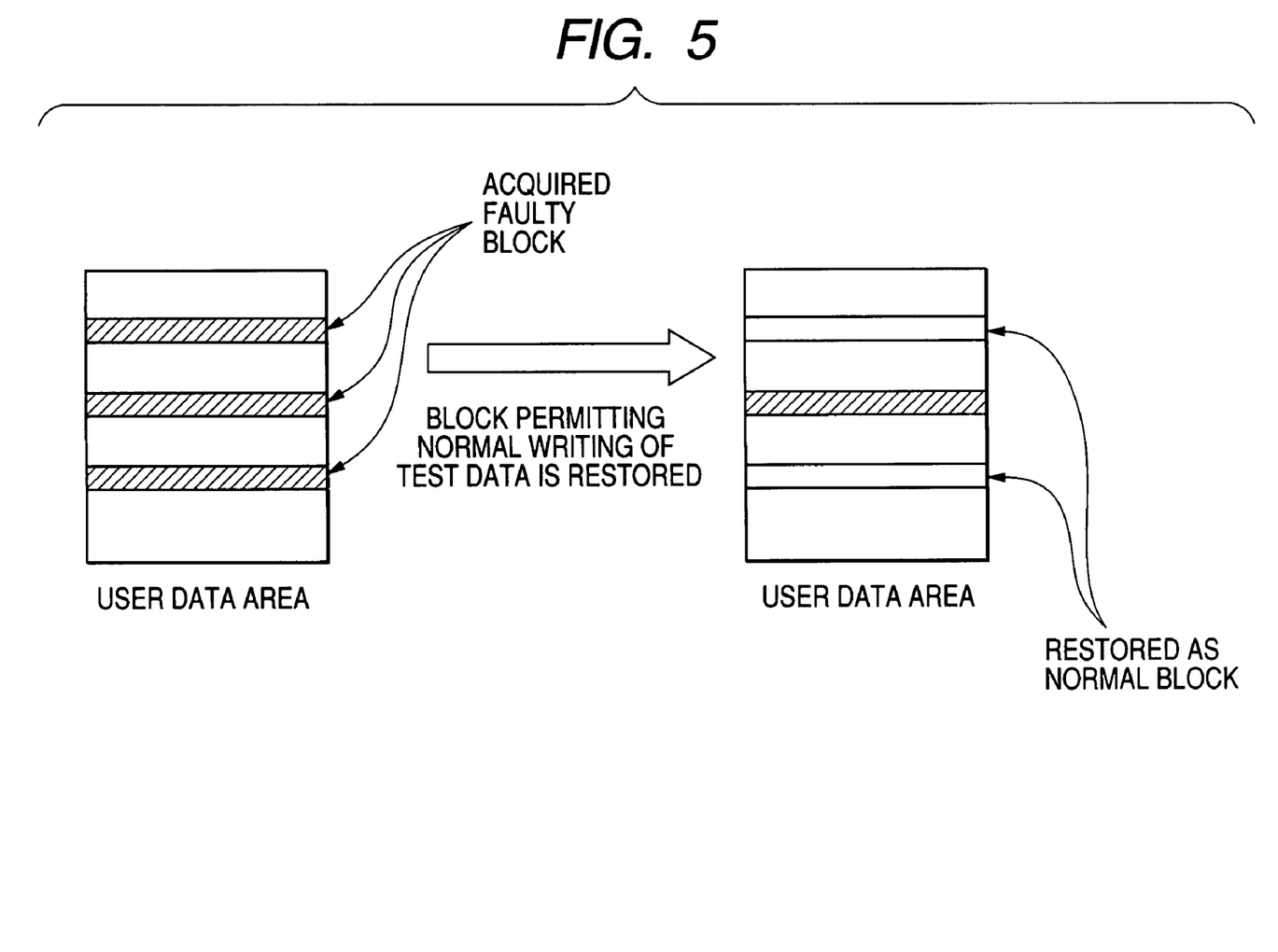
FIG. 5 illustrates faulty block restoration processing, which is one way of life elongation processing.
Figure 6:
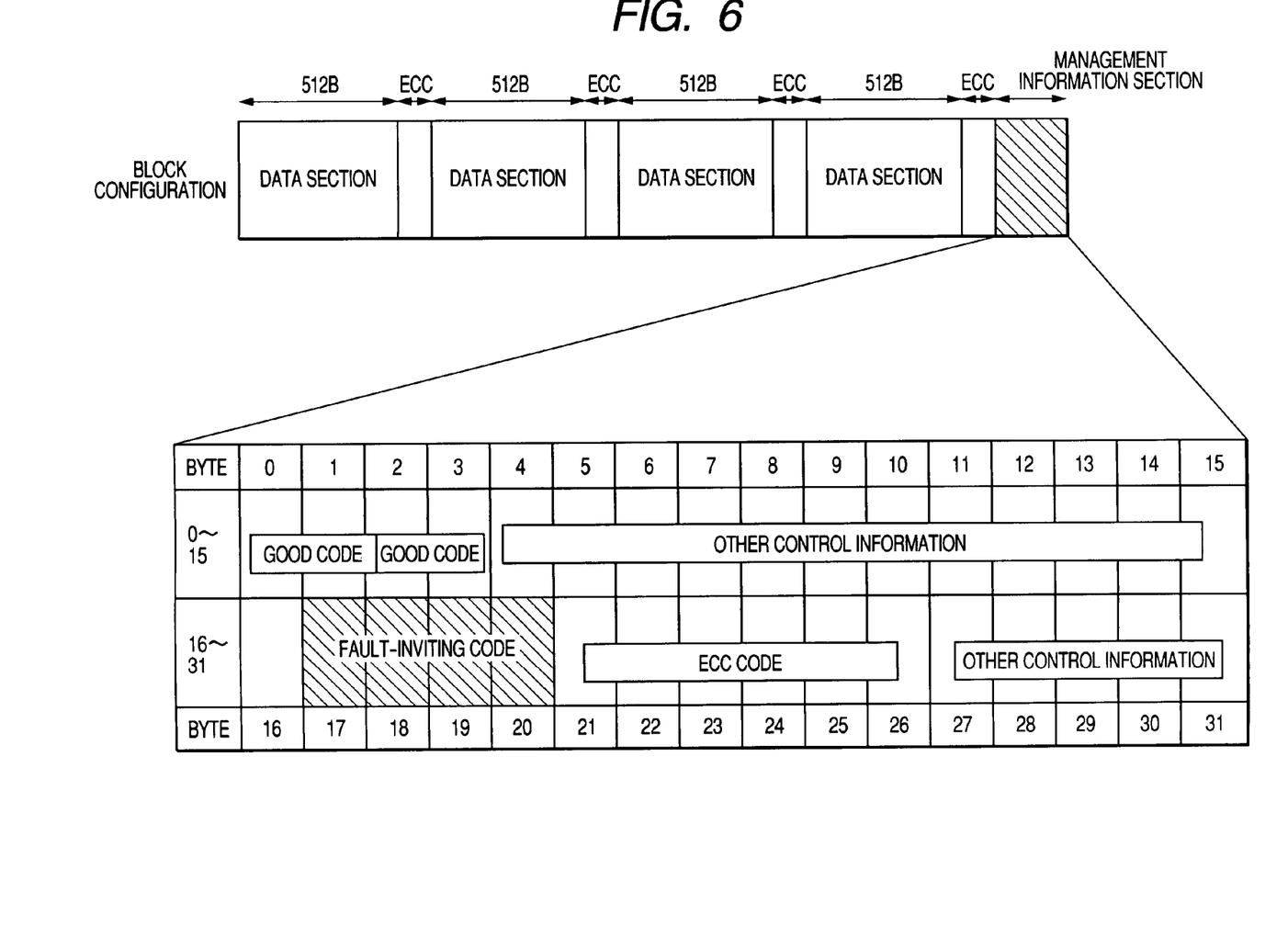
FIG. 6 illustrates one example of storage of management information in a management information section in the nonvolatile memory cell array of FIG. 2.
Figure 7:
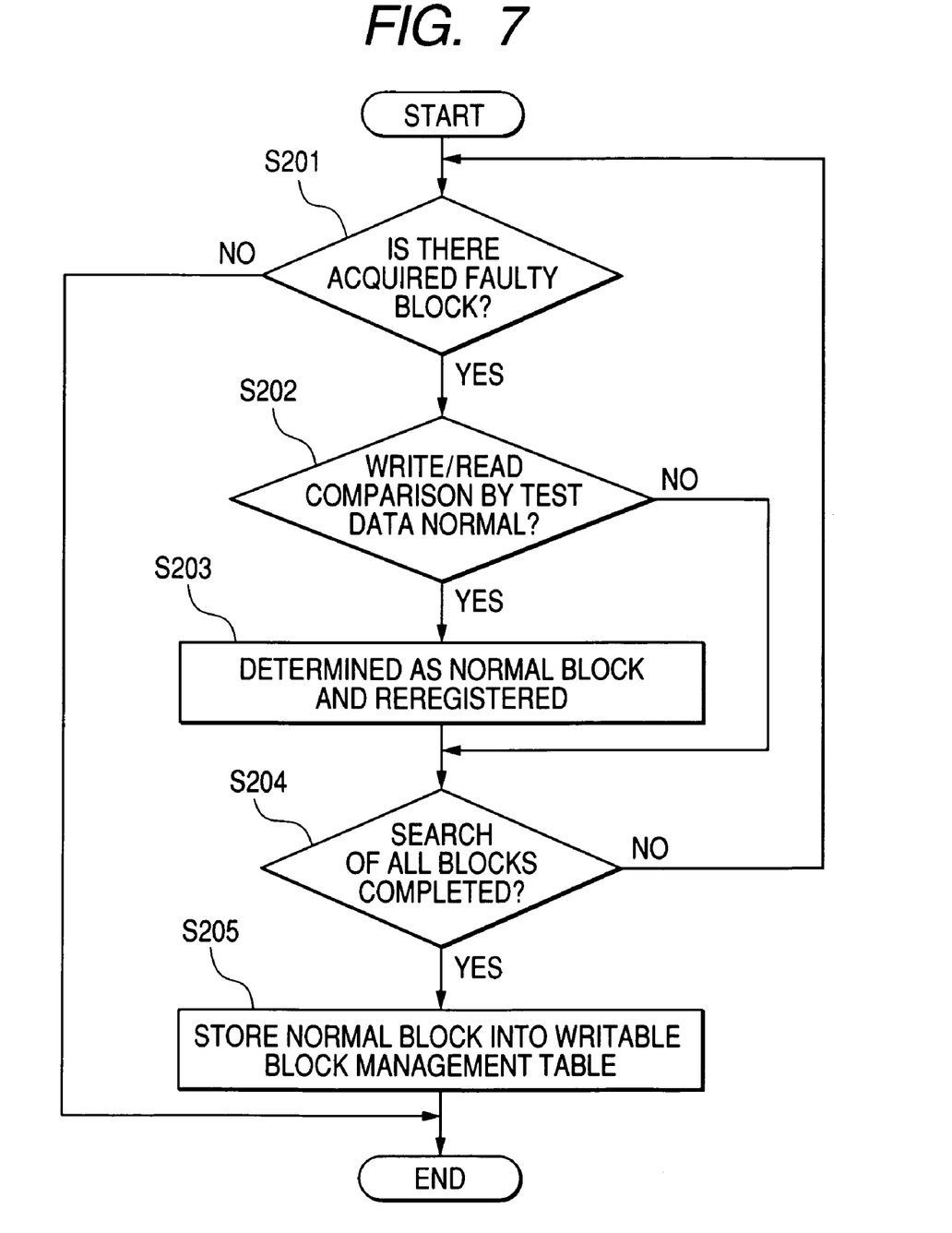
FIG. 7 is a flow chart showing faulty block restoration processing in the memory card of FIG. 1.
Figure 8:
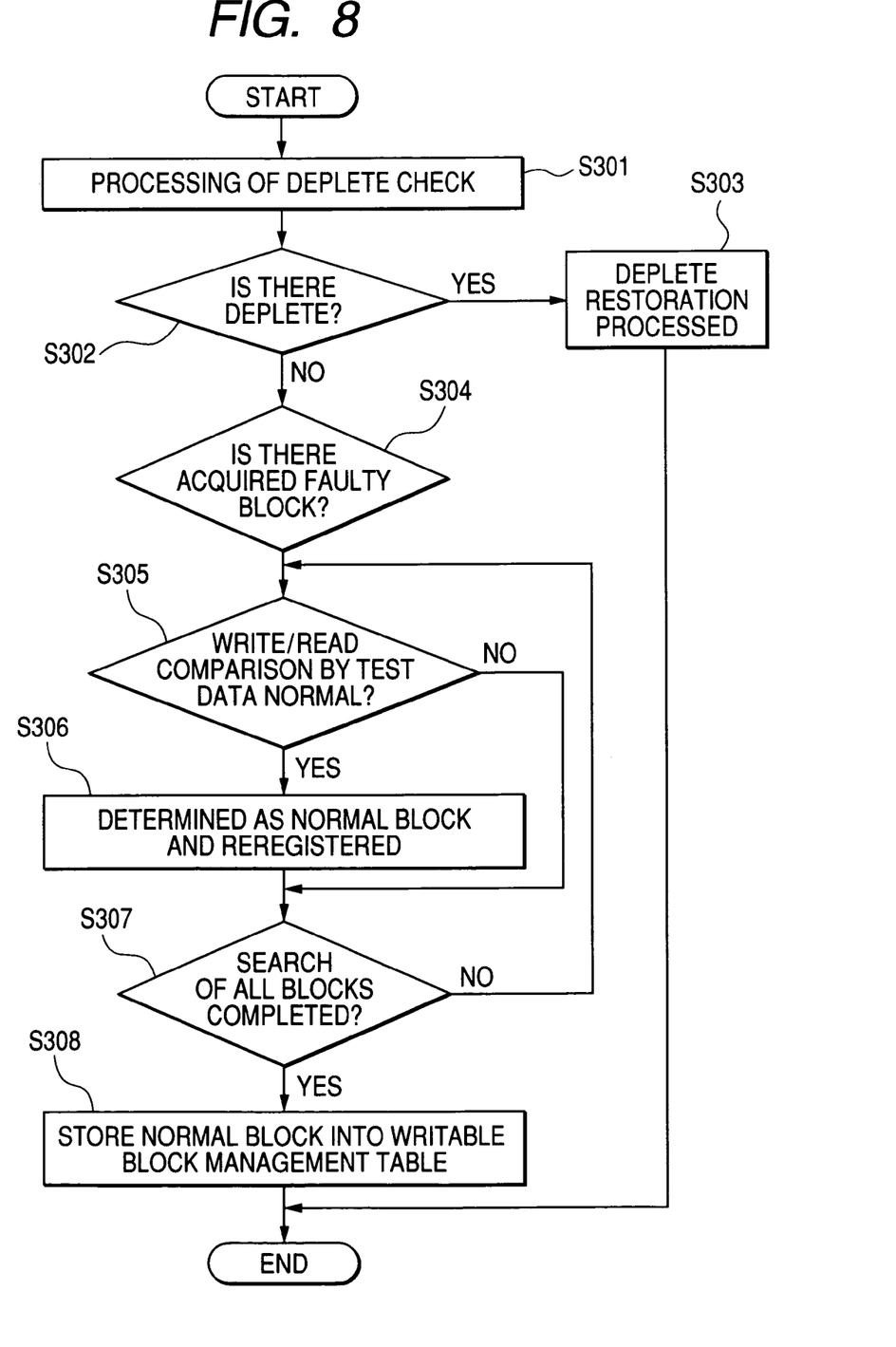
FIG. 8 is a flow chart of the faulty block restoration processing shown in FIG. 7 in the presence of a function to check faulty deplete.
Figure 9:
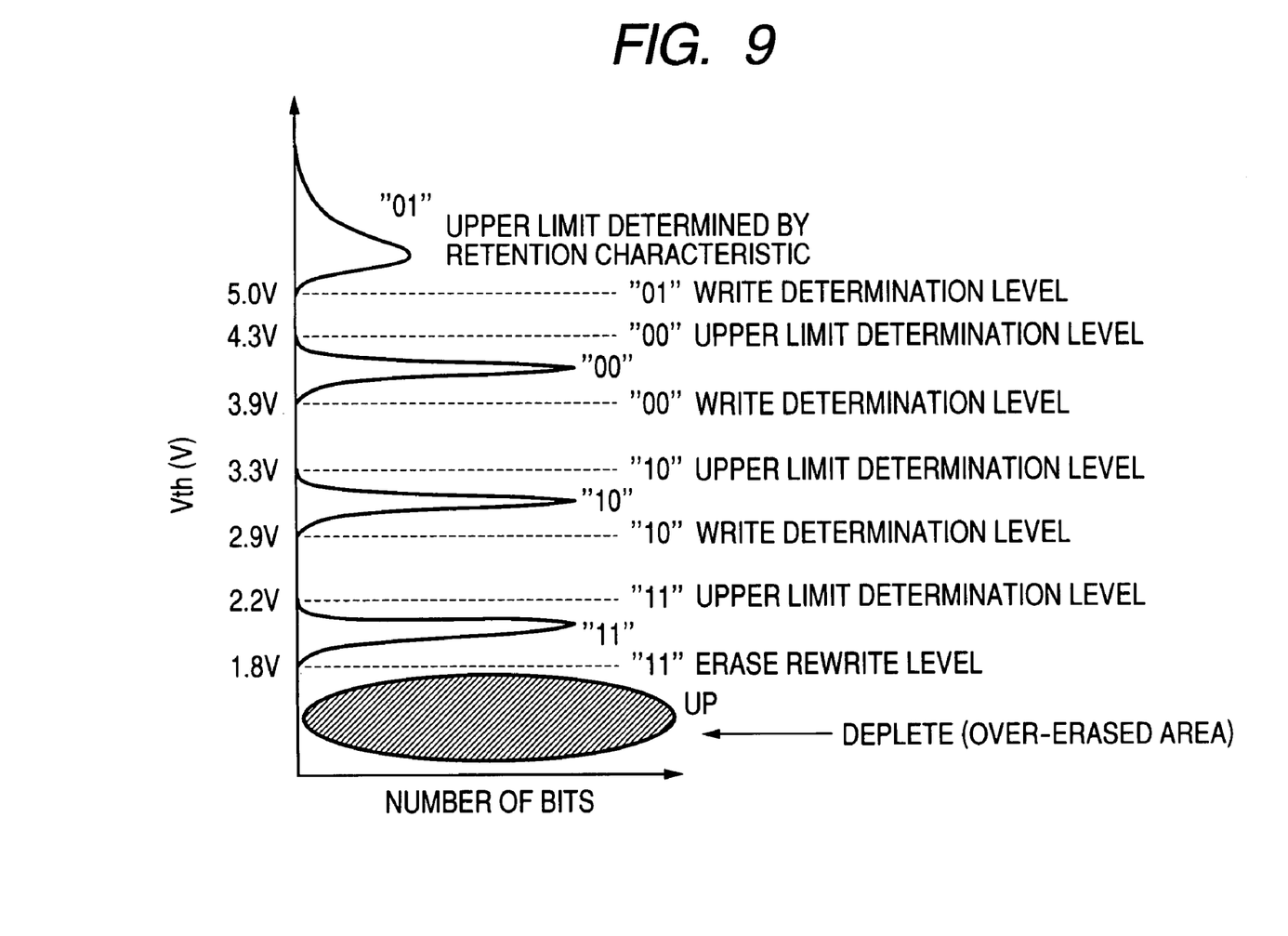
FIG. 9 illustrates faulty deplete in the nonvolatile memory cell array of FIG. 2.
Figure 10:
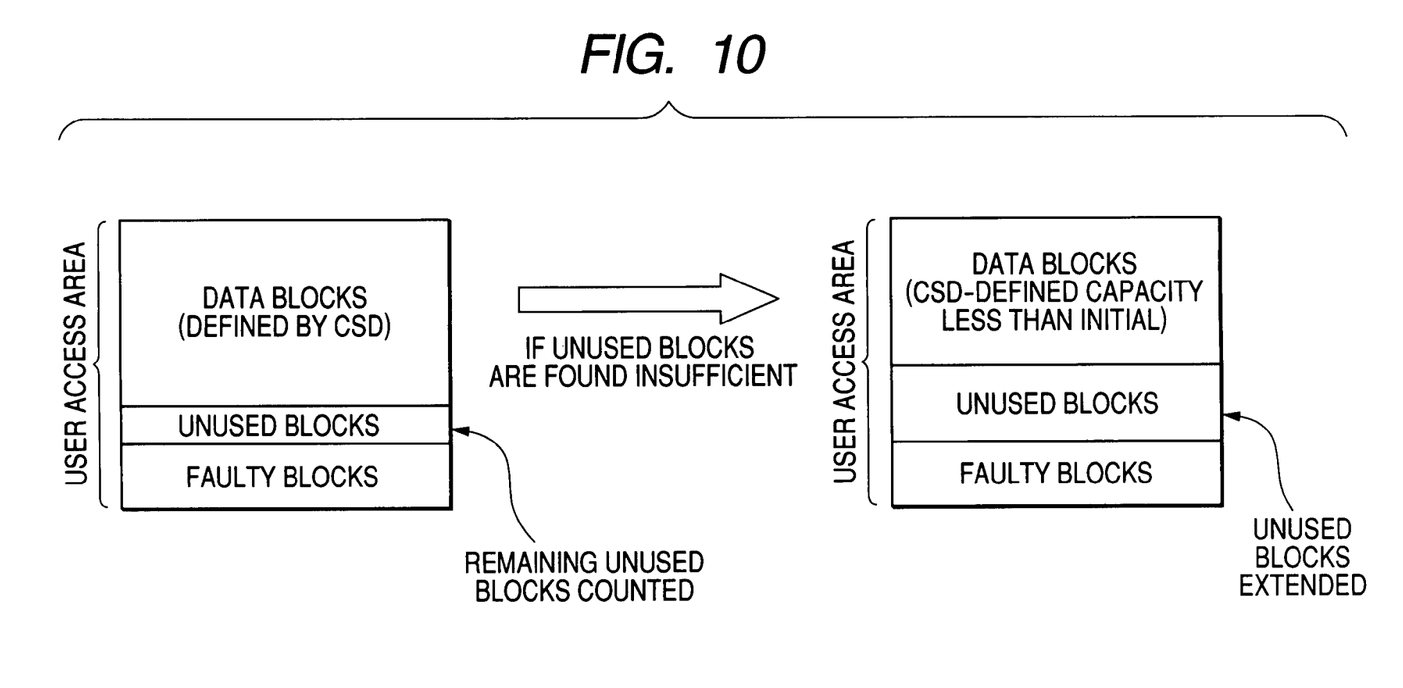
FIG. 10 illustrates one example of processing to alter the capacity of the memory card of FIG. 1.
Figure 11:
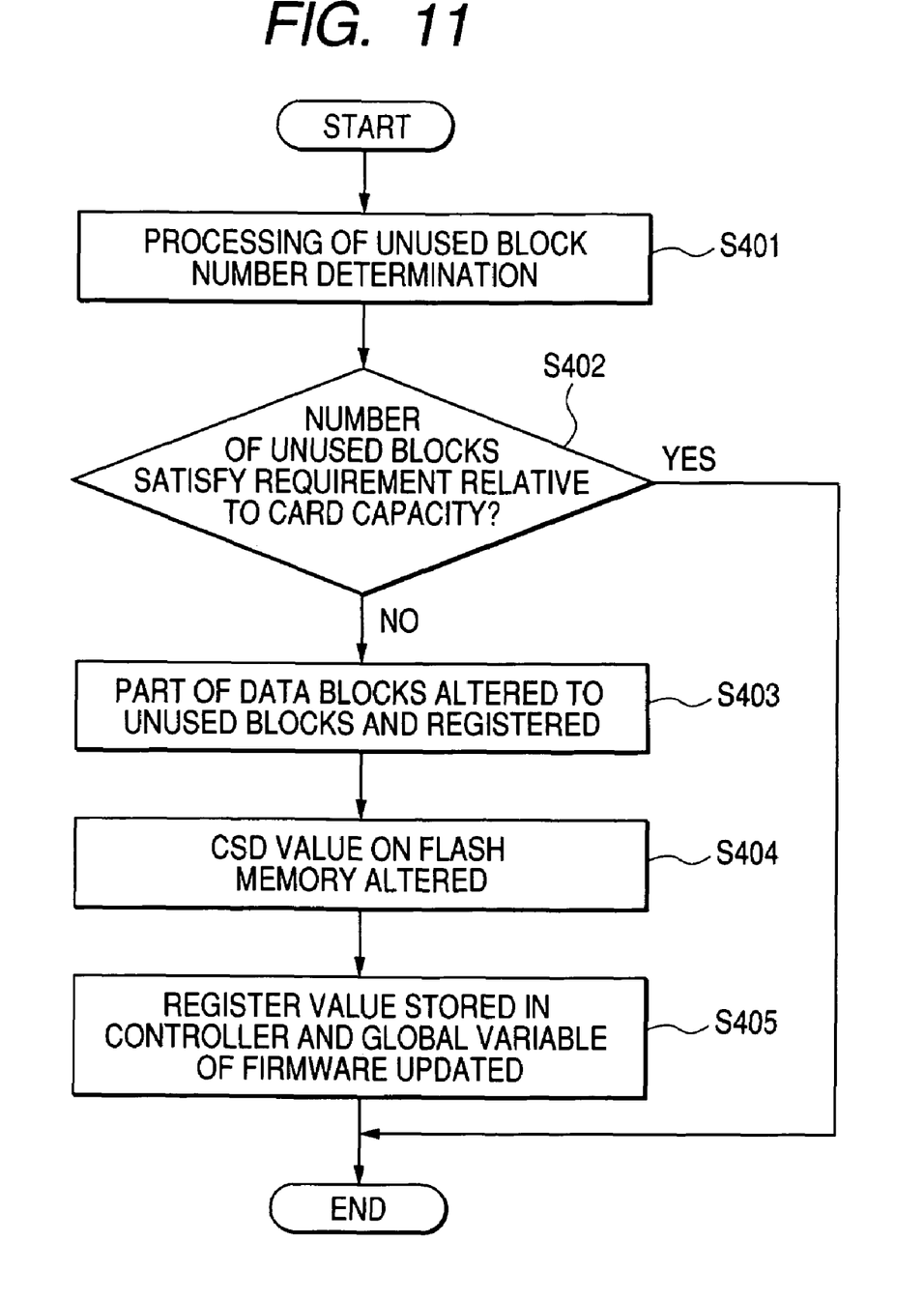
FIG. 11 is a flow chart showing capacity alteration processing for the memory card of FIG. 10.
Figure 12:
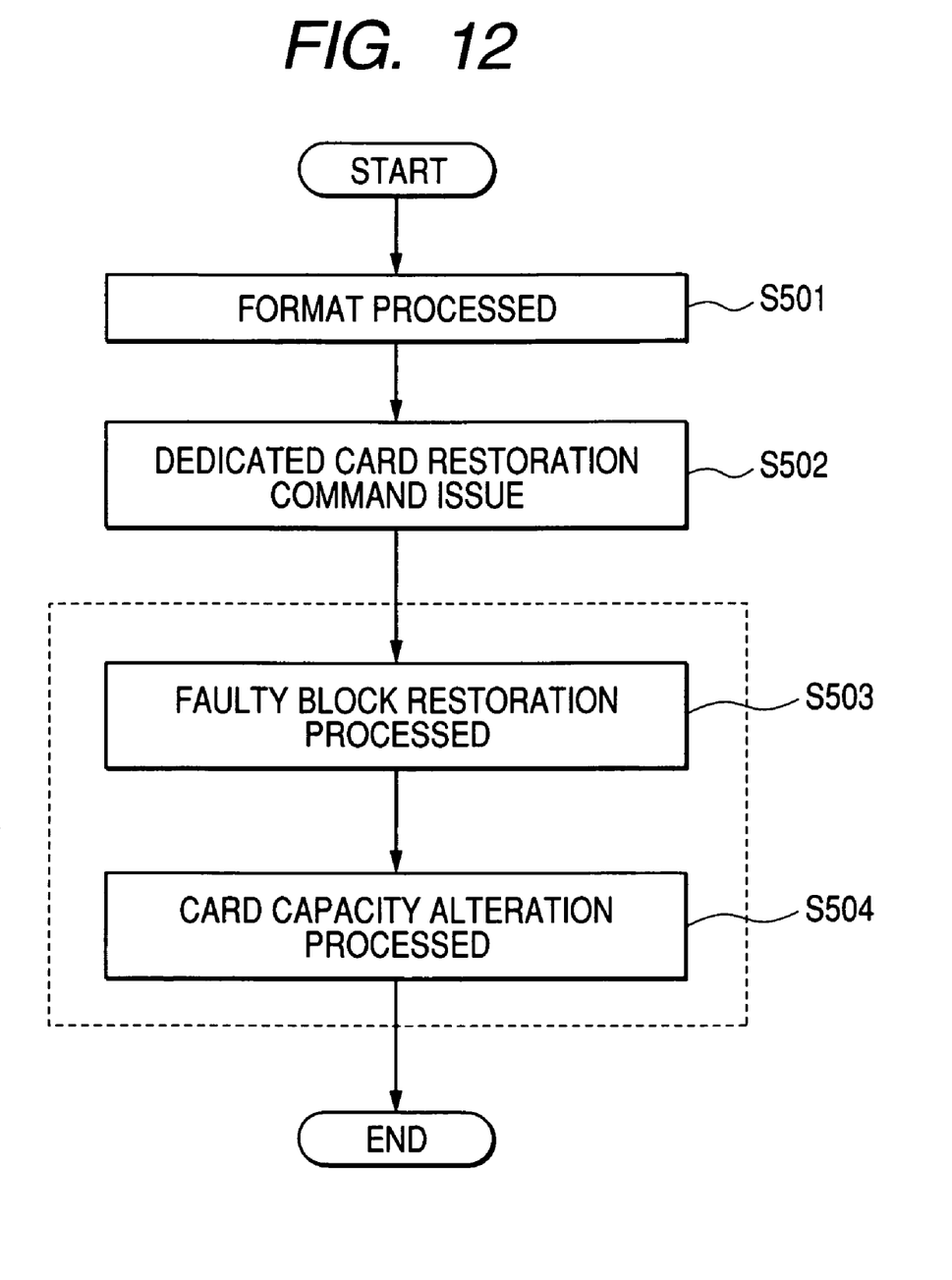
FIG. 12 is a flow chart showing the execution of faulty block restoration processing and memory card capacity alteration processing in formatting the memory card of FIG. 1.

FIG. 1 is a block diagram of a memory card, which is a preferred embodiment of the invention; FIG. 2, the configuration of a nonvolatile memory cell array provided in the memory card of FIG. 1; FIG. 3, a sectional view showing the structure of a memory cell provided in the nonvolatile memory cell array of FIG. 2; FIG. 4, a flow chart showing one example of life elongation processing in the memory card of FIG. 1; FIG. 5 illustrates faulty block restoration processing, which is one way of life elongation processing; FIG. 6, one example of storage of management information in a management information section in the nonvolatile memory cell array of FIG. 2; FIG. 7 is a flow chart showing faulty block restoration processing in the memory card of FIG. 1; FIG. 8, a flow chart of the faulty block restoration processing shown in FIG. 7 in the presence of a function to check faulty deplete; FIG. 9 illustrates faulty deplete in the nonvolatile memory cell array of FIG. 2; FIG. 10, one example of processing to alter the capacity of the memory card of FIG. 1; FIG. 11 is a flow chart showing capacity alteration processing for the memory card of FIG. 1; FIG. 12, a flow chart showing the execution of faulty block restoration processing and memory card capacity alteration processing in formatting the memory card of FIG. 1; and FIG. 13, a flow chart showing the execution of faulty block restoration processing and memory card capacity alteration processing at the time of turning on power supply of the memory card of FIG. 1.

In this mode of implementing the invention, a memory card 1 is used as an external storage medium for a host device HT, which may be a digital video camera, cellular phone, portable music player, personal computer or the like.

The memory card 1 is configured of a flash memory (nonvolatile semiconductor memory) 2 and a controller 3 as shown in FIG. 1. The flash memory 2 is a nonvolatile semiconductor memory permitting electrical rewriting and erasion of data. Although the configuration illustrated here has one flash memory 2, the number of flash memory or memories 2 may be one or more.

The controller 3 comprises a control logic 4, a buffer 5, a buffer interface 6, a flash interface 7 and a host interface 8.

The controller 3 is connected to the host device HT, controls the flash memory 2, and gives instructions to read out and supply to the host device HT programs and data stored in the flash memory 2 or to write programs and data entered from the host device HT.

The control logic 4 takes charge of every control by the controller 3. This control logic 4 has a built-in ROM, in which a control program for operating the control logic 4 and the like are stored.

The buffer 5, consisting of a volatile memory such as a static random access memory (SRAM), is used as a buffer memory in transferring data to the work area of a CPU provided in the control logic 4 and to the host device HT.

The buffer interface 6 is an interface between the control logic 4 and the buffer 5, while the flash interface 7 is an interface between the control logic 4 and the flash memory 2. The host interface 8 is an interface between the control logic 4 and the host device HT.

The flash memory 2 comprises an SRAM 2a, which is a volatile memory, and a nonvolatile memory cell array 2b. The SRAM 2a is used as a buffer when writing or reading a program or data into or out of the nonvolatile memory cell array 2b.

Firmware, which is a program for adding a function to or altering or correcting a function in the control program (firm on flash), may be stored in this flash memory 2 apart from the programs stored in the built-in ROM of the control logic 4.

This firm on flash can be rewritten as many times as desired, and permits ready alteration or addition of functions even in the product stage.

The nonvolatile memory cell array 2b of the flash memory 2 consists of a user-accessible area (user data area) and a user-inaccessible area. The user-accessible area consists of a plurality of blocks accessible by the user. The user-inaccessible area, which the user cannot access, is a management area.

Each block consists of data sections (user data area) which the user can use and a management information section in which data for managing those data sections are stored.

The management information section comprises a table area having a writable block management table indicating the blocks into which data can be written and an address conversion table indicating the addresses of blocks into which data have been written, and a system area in which control information data for overall control of the memory card 1 are stored.

FIG. 2 illustrates the configuration of the nonvolatile memory cell array 2b.

In this case, the nonvolatile memory cell array 2b has a configuration having two sub-blocks, each of which accommodates 128 word lines WL for instance, and each sub-block is provided with 128 blocks.

Each memory cell S of the nonvolatile memory cell array 2b consists of an AND type for instance, and a local data line LDL is connected to the diffusion layer of the memory cell S, and each local data line LDL is connected to a global data line GDL via a switch SW.

FIG. 3 is a sectional view showing the structure of the memory cell S.

The memory cell S has a stacked structure in which are formed, for instance, a diffusion layer consisting of a source SC and a drain D, a floating gate FG over a semiconductor substrate W between those source SC and drain D via a tunnel film, and a control gate CG above the floating gate FG via an inter-layer insulating film.

The memory cell S stores information by having word line voltages applied to the control gate CG via the word lines WL and having electric charges held in the floating gate FG surrounded by a high energy barrier.

The memory card 1 is provided with a life elongation processing function. FIG. 4 is a flow chart showing one example of life elongation processing in the memory card 1.

The life elongation processing consists, as illustrated, of two steps including faulty block restoration processing (step S101) and memory card capacity alteration processing (step S102).

The faulty block restoration processing is processing by the controller 3 to retest a block which has been determined faulty and to restore it as a normal block.

Some of the faulty blocks may be essentially normal but determined faulty on account of an accidental or temporary reason, such as an erratic error. An erratic error is an excessive writing phenomenon which accidentally occurs when the host voltage is not constant when data are written or for a like reason, and this phenomenon may cause the controller 3 to mistake an otherwise normal block for a faulty block.

In the faulty block restoration processing, a faulty block is subjected to write/read comparison by test data (determination test), and a block which is found operating without any problem is restored as a normal block.

The memory card capacity alteration processing is processing to forcibly secure standby blocks by setting aside part of the data area serving normally as standby blocks when the number of faulty blocks remains not less than a prescribed value even after the faulty block restoration processing.

Next will be described the life elongation processing function of the memory card 1 in this mode of implementing the invention.

First, the faulty block restoration processing will be described with reference to FIG. 5.

The flash memory 2 has a management information section, which is an area provided for each block of the nonvolatile memory cell array 2b, and this management information section stores a fault-inviting code, which is error information for each block.

The fault-inviting code is an item of information regarding whether the fault of a given faulty block is innate or acquired. An innate fault is what is detected, for instance, at the time of selection of the flash memory 2. It is a permanent fault. An acquired fault is generated by the use of the memory card 1 or otherwise, and may be a permanent fault subsequently arising from the deterioration of the characteristics of a memory cell due to repeated writing/erasion or an accidental or temporary fault due to an erratic error.

For instance, where the fault-inviting code indicates the presence of three acquired faulty blocks in the nonvolatile memory cell array 2b as shown on the left side of FIG. 5, the controller 3 subjects these three faulty blocks to write/read comparison by test data, and restores as normal blocks those blocks in which data are confirmed to be normally written/read as shown on the right side of FIG. 5.

FIG. 6 illustrates one example of storage of management information in the management information section.

As illustrated, each block in the nonvolatile memory cell array 2b is configured of user data areas whose data length is 512 bytes ×4, an error checking correcting (ECC) code for data of 512 bytes and management information section of 32 bytes, and the block is managed on the basis of management information stored in the management information section.

The fault-inviting code is stored as error information in the 17th through 20th bytes in this management information section. As stated above, information indicating whether the fault of the pertinent faulty block is innate or acquired is included in this fault-inviting code.

Next, the faulty block restoration processing in the memory card 1 will be described in detail with reference to the flow chart of FIG. 7.

First, the control logic 4 searches blocks in the nonvolatile memory cell array 2b for any acquired fault on the basis of the fault-inviting code in the management information section (step S201).

If there is any acquired faulty block, the detected faulty block will be subjected to write/read comparison of data to judge whether or not the data are normal (step S202). Alternatively, if no acquired faulty block is found in the processing at step S201, the faulty block restoration processing will be ended.

If there is any block having normally gone through the write/read comparison in the processing at step S202, that block will be determined to be a normal block, the fault-inviting code of the block will be rewritten and this block will be registered as a normal block (step S203). If the write/read comparison in the processing at step S202 does not prove normal, the processing at step S204 will be executed.

Upon completion of the processing of all these steps S201 through S203 for every block (step S204), the blocks registered in the processing at step S203 as normal blocks are stored into the writable block management table in the management area as writable blocks (step S205).

The faulty block restoration processing described above enables essentially normal blocks judged faulty on account of an erratic error or some other reason to be restored.

FIG. 8 is a flow chart of the faulty block restoration processing shown in FIG. 7 in the presence of a function to check faulty deplete.

First, the control logic 4 executes processing of deplete check in the nonvolatile memory cell array 2b (step S301).

Hereupon, an explanation of deplete may be relevant. In erasing multi-value data in memory cells in the flash memory 2, the voltage of the memory cells is once reduced to the lower limit of the erase rewrite level (e.g. about 1.8 V) and then raised to about 1.8 V to 2.2 V as shown in FIG. 9.

For this reason, if voltage supply to the flash memory 2 is stopped (power cut-off) during the erasing operation, there will emerge an over-erased state in which the threshold voltage of any memory cell remains at or below the erase rewrite level (in particular a state in which the threshold voltage of the memory cell becomes negative). A memory cell having fallen into such an over-erased state is referred to as being under faulty deplete.

If any memory cell under faulty deplete emerges in the processing at step S301 (step S302), processing of restoration from faulty deplete will be executed (step S303). In this case, the processing at step S303 is performed, and the process will end without executing the subsequent processing of steps S304 through S308.

Alternatively, in the absence of any memory cell under faulty deplete in the processing at step S301 (step S302), the processing of steps S304 through S308 is executed. As the processing of these steps S304 through S308 is the same as that of steps S201 through S205 in FIG. 7, its description will be dispensed with.

Next will be described the memory card capacity alteration processing.

FIG. 10 illustrates one example of processing to alter the capacity of the memory card 1.

By the memory card capacity alteration processing, as shown on the left side of FIG. 10, the number of unused blocks (constituting a standby area), prescribed by CSD (card specific data) stored in the system area, in the user-accessible area in the nonvolatile memory cell array 2b is counted and, if the unused capacity is judged to be insufficient, unused blocks in the user-accessible area will be altered as shown on the right side of FIG. 10.

The CSD are data representing various items of information relating to the memory card 1 including the matching version of specification, card capacity, access time and the length of transfer unit block.

On the other hand, in the case of the logical/physical coherent formula by which a logical address designated by the host is assigned as it is to the physical address of the flash memory, if the standby area is judged to be insufficient for the memory card capacity prescribed by the CSD, the standby area will be expanded until it reaches the prescribed size by reducing the user data area available for use by the user.

This memory card capacity alteration processing will be described in more detail with reference to the flow chart of FIG. 11.

First, the controller 3 processes determination of the number of unused blocks in the flash memory 2 (step S401). This unused block number determination is performed by, for instance, searching and counting all the blocks in the user-accessible area or counting the number of unused blocks (or faulty blocks) from specific blocks in which faulty addresses are registered.

It is then judged whether or not the number of unused blocks is equal to or greater than a number predetermined on the part of the controller for the CSD-prescribed memory card capacity (step S402) and, if the number is found sufficient, the processing will be ended. Alternatively, if it is not, part of the data section in the user-accessible area will be re-registered as unused blocks (step S403) In the processing at this step S403, for instance, part of the unwritable area (area in which addresses are assigned) in the writable block management table is forcibly altered into a writable area (unoccupied area). The number of blocks to be altered conforms to a parameter for instance.

Here in the processing at step S403, if the flash memory 2 uses the above-described logical/physical coherent formula, part of the user data area will be altered into an unused area and registered as such.

After that, out of the CSD values stored in the system area of the nonvolatile memory cell array 2b, a parameter pertaining to the capacity of the memory card 1 is altered (step S404), and a reduction in the capacity of the memory card 1 is processed.

Then, the register value of the CSD stored in the control logic 4 of the controller 3 is updated, and a global variable pertaining to the capacity of the memory card 1 used by the firmware of the control logic 4 is updated to match the register value of the CSD (step S405).

By this memory card capacity alteration processing, the card capacity is reduced, but if the number of unused blocks predetermined on the part of the controller regarding the CSD-prescribed memory card capacity is not reached even after the faulty block restoration processing, it will still be possible to elongate the service life of the memory card 1.

Then, the faulty block restoration processing charted in FIG. 7 or FIG. 8 and the memory card capacity alteration processing charted in FIG. 11 will be described with reference to the flow chart of FIG. 12 which shows the processing to be executed in formatting the memory card 1.

First, formatting is processed for MS-DOS (Microsoft Disk Operating System, a registered trademark of Microsoft Corporation of the U.S.), which is one of the available formats for the memory card 1 (step S501).

After that, a dedicated command for faulty block restoration processing is issued by the host device HT (step S502), and the controller 3, in accordance with that dedicated command, performs the faulty block restoration processing shown in FIG. 7 or FIG. 8 (step S503), followed by the execution of the card capacity alteration processing shown in FIG. 11 (step S504).

Figure 13:
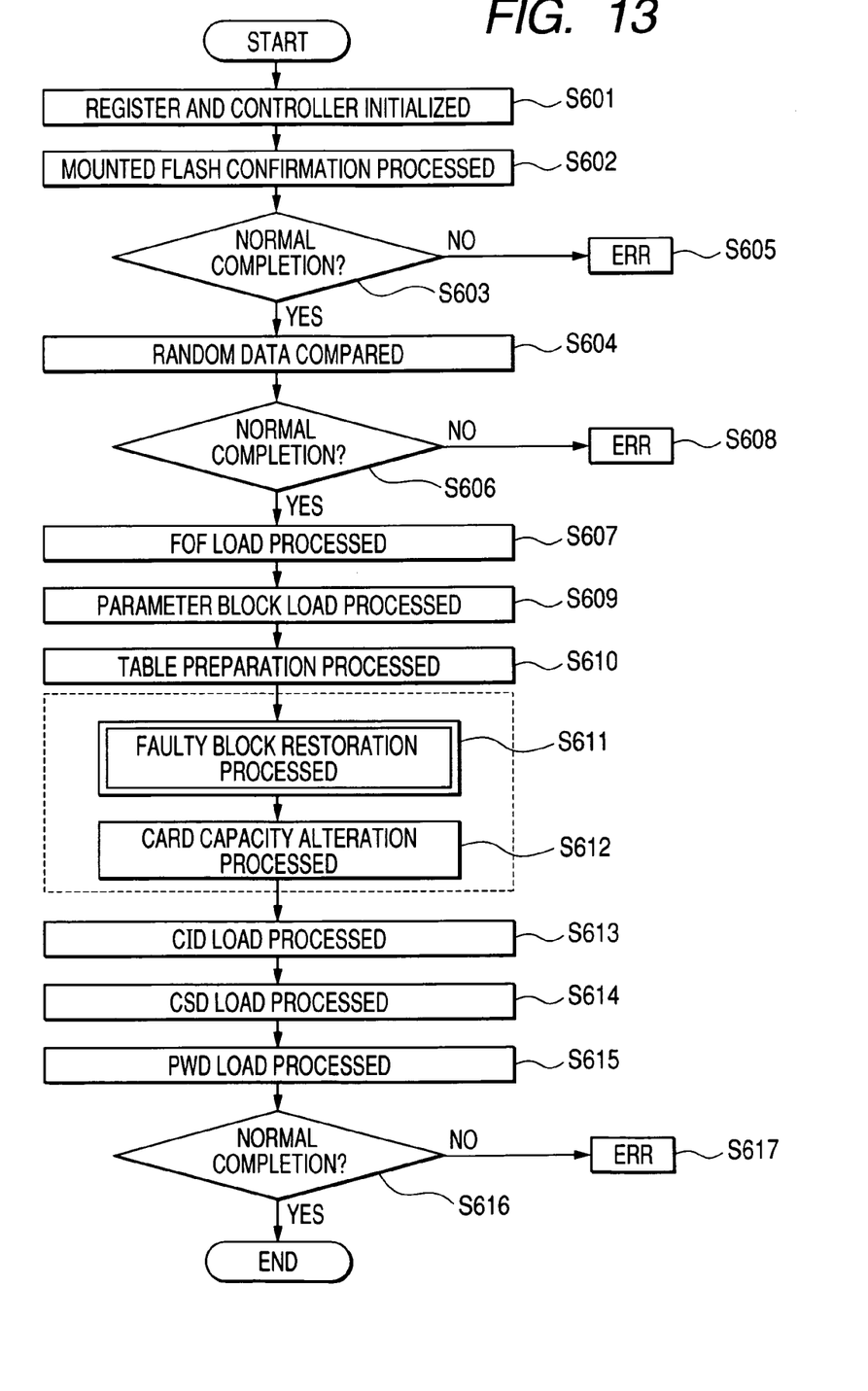
FIG. 13 is a flow chart showing the execution of faulty block restoration processing and memory card capacity alteration processing at the time of turning on power supply of the memory card of FIG. 1.

FIG. 13 is a flow chart showing the execution of the faulty block restoration processing of FIG. 7 or FIG. 8 and the memory card capacity alteration processing of FIG. 11 at the time of turning on power supply of the memory card 1.

When the memory card 1 is inserted into a memory slot or the like provided in the host device HT, a source voltage is supplied to the memory card 1 via a connector terminal of the memory slot.

When power supply of the memory card 1 is turned on, initial setting of the control logic 4 and a hardware register is started (step S601). After that, the controller 3 checks the number of chips, type and other aspects of the flash memory 2 mounted on the memory card 1 (step S602).

If the checkup processing at step S602 is normally completed (step S603), the control logic 4 will compare the checkup data stored in itself and those read out of the flash memory 2 (step S604) and, if these sets of data are found identical, the flash memory 2 will be judged to be readable.

Alternatively, if the checkup processed at step S602 is found abnormal, the process will be ended by error (step S605), followed by a standby state of waiting for the execution of initialize processing again.

If the processing at step S604 is normally completed (step S606), the controller 3 checks whether or not items of firmware including a batch program for the control program and an additional control program for expanding the functions of the control program stored in a ROM are stored in the flash memory 2 and, if such items of firmware for addition or alteration are found stored in the flash memory 2, will perform so-called firm on flash read operation, namely read out those firmware programs (step S607).

Or if the processing at step S604 is abnormal, the process will be ended by error (step S608), followed by a standby state of waiting for the execution of initialize processing again.

Then, the controller 3 reads out of the flash memory 2 various parameters required for operation (step S609). After that, the controller 3 reads out of the flash memory 2 the address conversion table and the writable block management table needed for reading or writing data out of or into the host device HT, and develops them in the buffer 5 (step S610).

Next, after performing the faulty block restoration processing of FIG. 7 or FIG. 8 (step S611), the card capacity alteration processing of FIG. 11 is executed (step S612). Then, the controller 3 reads a card identification number (CID: card ID register) out of the system area of the flash memory 2 (step S613), and develops it in the buffer 5. The CID is a serial number assigned to each memory card 1, and used for allocating a relative address for selecting the memory card 1.

Then, the controller 3 reads the CSD out of the system area of the flash memory 2 (step S614) and develops it in the buffer 5. After that, the controller 3 reads out of the system area of the flash memory 2 password data (PWD) required for the locking function to lock the memory card 1, and develops it in the buffer 5 (step S615). Incidentally, where no security is needed, the processing at step S615 can be dispensed with.

Upon normal completion of the processing of all these steps S601 through S615 (step S616), the process is normally completed, and the process to turn on power supply is ended. If there is any abnormality (step S616), the process will be ended by error (step S617), followed by a standby state of waiting for the execution of initialize processing again.

This completes the power supply reset operation to initialize the memory card 1.

In this mode of implementing the invention, the service life of the memory card 1 can be thereby elongated, and at the same time the reliability of the memory card 1 can be significantly enhanced.

While the invention accomplished by the present inventor has been described so far in specific terms with reference to preferred embodiments thereof, obviously the invention is not confined to these embodiments, but can be modified in various ways without deviating from its true spirit and scope.

The techniques for relieving faulty blocks in a memory card according to the invention can be suitably applied to elongation of the service life of memory cards.

What is claimed is:

1. A memory card having a function to notify a host of a memory capacity of user-accessible area of said memory card, said memory card comprising:

a nonvolatile semiconductor memory having a plurality of nonvolatile memory cells and being capable of storing data; and a controller to provide instructions to operate said nonvolatile semiconductor memory based on externally issued commands, wherein said controller registers, as a faulty block, any block of said nonvolatile memory cells determined to be faulty in writing at a time of writing data into said nonvolatile semiconductor memory, wherein said controller executes, after registering a block determined to be faulty, a determination test to perform at least one of write and read comparison on said block determined to be faulty, and if said block is found to be normal based on said determination test, said controller determines said block to be a good block for re-registering said block as a normal block, wherein said controller executes said determination test in response to a dedicated command issued from outside or in response to a power on reset sequence, wherein, after said determined faulty block is re-registered as a normal block, if a number of normal blocks in a valid data area is not more than a prescribed value, said controller reduces said memory capacity of said user-accessible area, secures a block in said valid data area as a standby area, and alters said memory capacity of said user-accessible area stored in a system area of said nonvolatile semiconductor memory to a reduced memory capacity, and wherein said controller executes said power on reset sequence after altering said memory capacity of said user-accessible area stored in said system area of said nonvolatile semiconductor memory to said reduced memory capacity.

2. The memory card according to claim 1, wherein, after altering said memory capacity of said user-accessible area stored in said system area to said reduced memory capacity of said user-accessible area, said controller alters said memory capacity of said user-accessible area stored in a register in said controller to said reduced memory capacity of said user-accessible area.

3. The memory card according to claim 1, wherein said nonvolatile semiconductor memory further comprises:

a writable block management table indicating a plurality of said blocks into which data can be written; and an address conversion table indicating a plurality of addresses of blocks into which data have been written, and wherein said controller performs an arbitrary one of a data erase operation, a data read operation, and a data write operation by a process using said writable block management table and said address conversion table.

4. The memory card according to claim 1, wherein said nonvolatile semiconductor memory further comprises:

an address conversion table which converts between an address of a block into which data have been written and a logical address corresponding to said address of said block, and wherein said controller performs an arbitrary one of a data erase operation, a data read operation, and a data write operation by a process using said address conversion table.

* * * * *